(12) United States Patent
Long et al.

(10) Patent No.: US 7,321,491 B2
(45) Date of Patent: Jan. 22, 2008

(54) HEAT SINK FOR A PORTABLE COMPUTER

(75) Inventors: Jun Long, Guangdong (CN); Yong Zhong, Guangdong (CN); Tao Li, Guangdong (CN); Wan-Lin Xia, Guangdong (CN)

(73) Assignees: Fu Zhun Precision Industry (Shen Zhen) Co., Ltd., Longhua Town, Bao'an District, Shenzhen, Guangdong Province; Foxconn Technology Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/308,273

(22) Filed: Mar. 15, 2006

(65) Prior Publication Data

US 2007/0217150 A1    Sep. 20, 2007

(51) Int. Cl.
*H05K 7/20* (2006.01)
*F28D 15/00* (2006.01)
*H01B 7/42* (2006.01)

(52) U.S. Cl. ............ 361/687; 361/700; 361/702; 361/704; 361/709; 361/756; 165/80.5; 165/104.33; 174/15.2

(58) Field of Classification Search ........... 361/720, 361/737, 741, 756, 687, 699–704, 707, 709–710; 165/80.3–80.5, 104.33, 185; 174/15.2
See application file for complete search history.

(56) References Cited

U.S. PATENT DOCUMENTS

| 5,808,869 | A | * | 9/1998 | Donahoe et al. ............ 361/704 |
| 6,178,096 | B1 | * | 1/2001 | Flickinger et al. .......... 361/816 |
| 6,181,553 | B1 | * | 1/2001 | Cipolla et al. .............. 361/687 |
| 6,219,233 | B1 | | 4/2001 | Moore et al. |
| 6,382,307 | B1 | * | 5/2002 | Wang et al. ................ 165/80.3 |
| 6,560,104 | B2 | * | 5/2003 | DeHoff et al. .............. 361/687 |
| 6,738,256 | B2 | | 5/2004 | Hsieh et al. |
| 6,966,363 | B2 | * | 11/2005 | Gailus et al. ................ 165/185 |
| 2005/0225942 | A1 | * | 10/2005 | Lee ........................... 361/700 |

OTHER PUBLICATIONS

PCMCIA PC Card Standard, Release 2.01, Personal Computer Memory Card International Association, Nov. 1992, p. 3-17.*

* cited by examiner

*Primary Examiner*—Jayprakash Gandhi
*Assistant Examiner*—Robert J. Hoffberg
(74) *Attorney, Agent, or Firm*—Winston Hsu

(57) ABSTRACT

A heat sink (200) for a portable computer (100) includes a plurality of fins (210) located external to the portable computer, a conducting plate (230) extending into an inner space of the portable computer for absorbing heat in the portable computer, and a heat pipe (220) transferring the heat absorbed by the conducting plate to the fins. Therefore, the heat in the portable computer is removed from the inner space of the portable computer by the heat sink.

14 Claims, 3 Drawing Sheets

HEAT SINK FOR A PORTABLE COMPUTER

DESCRIPTION

1. Field of the Invention

The present invention relates to a heat sink connecting with a portable computer, and particularly to a heat sink having heat pipes to conduct heat generated by heat-generating electronic elements in a portable computer out of the portable computer.

2. Description of Related Art

Portable computers are often referred to as laptop or notebook computers. The portable computers are being required to accommodate increasingly high thermal loads. To be portable, these computers must be very restricted in space, power, and weight, and such restrictions create significant problems in cooling heat-generating electronic components in the computers and disposing of the heat generated by heat-generating electronic components. Since the usable space therein has been utilized sufficiently, the space for heat dissipation is even smaller, and a larger cooling device is inappropriate to the space. Furthermore, almost all the heat generated from an interior portion of the portable computer is dissipated through an external metal casing thereof. However, the heat dissipation achieved only by exchanging the heat between the external metal casing and atmospheric air is not very effective and is unable to enhance the heat dissipation efficiency of the portable computer.

A heat sink which overcomes the above-mentioned problems and shortcomings is desired.

SUMMARY OF INVENTION

According to a preferred embodiment of the present invention, a heat sink for a portable computer comprises a plurality of fins located external to the portable computer, a conducting plate extending into an inner space of the portable computer for absorbing heat in the portable computer, and a heat pipe transferring the heat absorbed by the conducting plate to the fins. Therefore, the heat in the portable computer is transferred from the inner space of the portable computer by the heat sink.

Other advantages and novel features of the present invention will become more apparent from the following detailed description of preferred embodiment when taken in conjunction with the accompanying drawings, in which:

DETAILED DESCRIPTION

Figure 1:
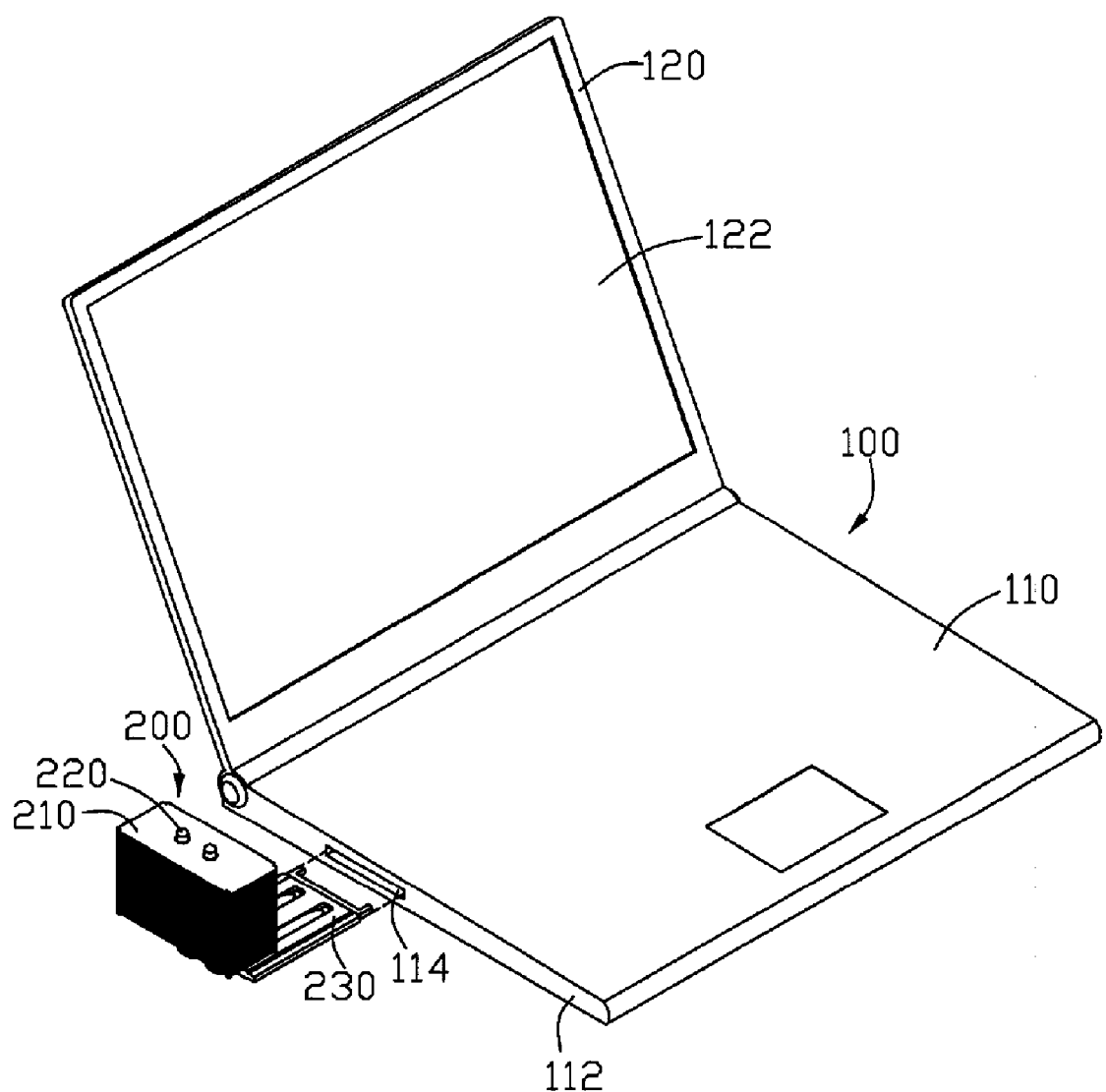
FIG. 1 is an assembled view of a heat sink according to a preferred embodiment of the present invention, and a portable computer.

FIG. 1 shows a heat sink 200 in accordance with a preferred embodiment of the present invention which is connected to a portable computer 100.

The portable computer 100 comprises a base portion 110 and a lid portion 120 that pivotally opens from the base portion 110 when the portable computer 100 is in use. The lid portion 120 contains a flat panel display 122 such as a liquid crystal display (LCD) or other suitable display. The base portion 110 forms a lateral portion 112. An extensible interface 114 or a slot communicating with an internal space of the base portion 110 of the portable computer 100 is defined in the lateral portion 112, for receiving a conducting plate 230 of the heat sink 200.

Figure 2:
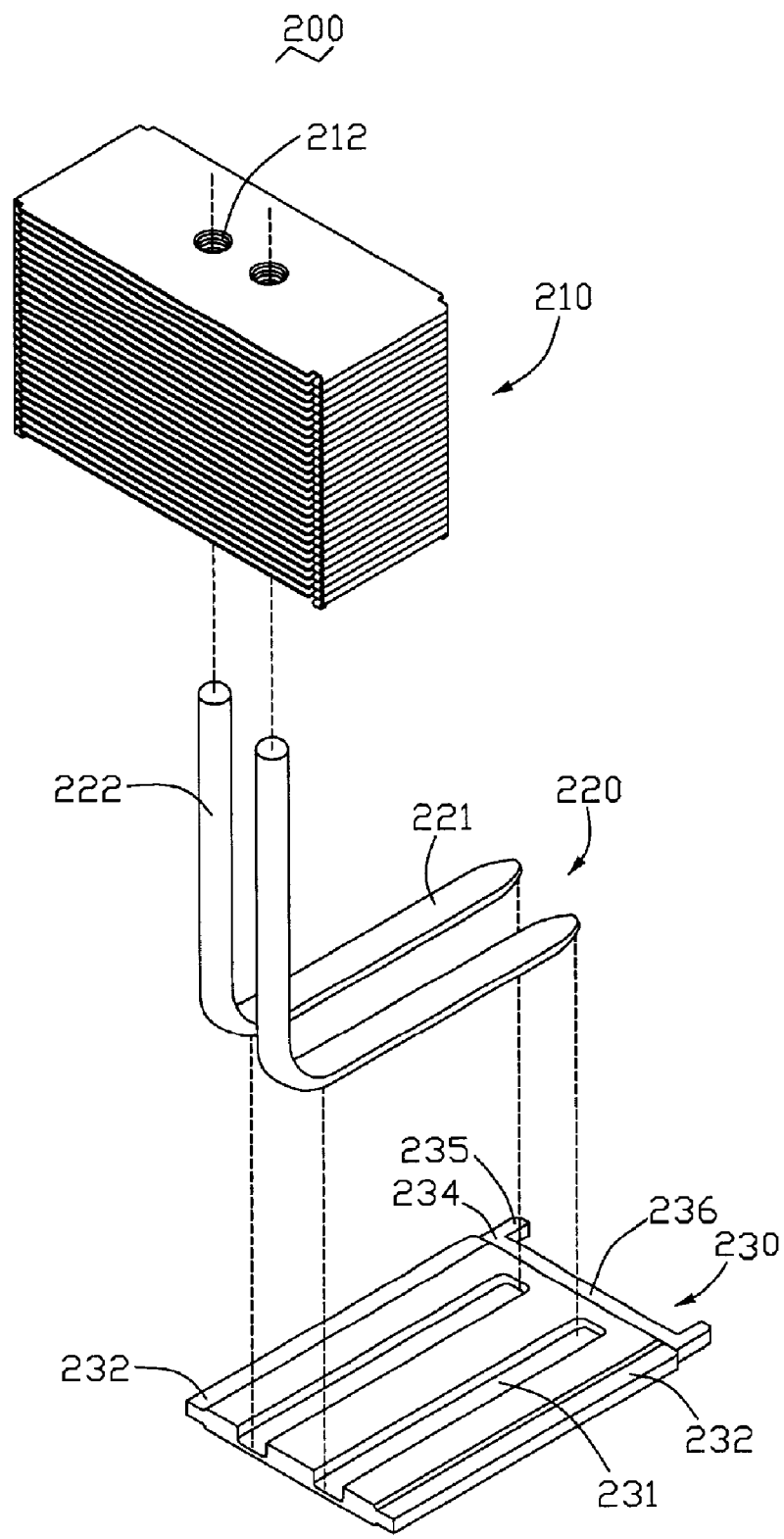
FIG. 2 is an exploded, isometric view of the heat sink of FIG. 1.

Also referring to FIG. 2, the heat sink 200 comprises the conducting plate 230, a plurality of fins 210 spaced from and snapped with each other, and a pair of L-shaped heat pipes 220 thermally connected the conducting plate 230 and the fins 210. Each of the fins 210 is perforated with two through holes 212, corresponding to condensing portions 222 of the heat pipes 220.

The conducting plate 230 is made of metallic material with good heat conductivity such as copper, for absorbing heat generated by heat-generating electronic components (not shown) in the portable computer 100. The conducting plate 230 defines a pair of slots 231 at a top portion thereof, for receiving evaporating portions 221 of the heat pipes 220. A pair of steps 232 is respectively formed at opposite front and rear lateral sides of the conducting plate 230. A thickness of the step 232 is less than that of the conducting plate 230. A leading portion 234 is formed at a right longitudinal side of the conducting plate 230, for engaging in the extensible interface 114 of the portable computer 100. The leading portion 234 has a thickness less than that of the conducting plate 230, for facilitating insertion of the leading portion 234 in the extensible interface 114 of the portable computer 100. The leading portion 234 comprises a pair of symmetrical legs 235 and a middle portion 236 perpendicularly connecting the legs 235.

Each heat pipe 220 comprises the evaporating portion 221 which is horizontal and flattened, and the condensing portion 222 vertically extending from a free end of the evaporating portion 221. The flattened evaporating portions 221 of the heat pipes 220 are soldered in the slots 231 of the conducting plate 230. Top surfaces of the evaporating portions 221 are coplanar with a top surface of the conducting plate 230. The condensing portions 222 of the heat pipes 220 are soldered in the through holes 212 of the fins 210.

Figure 3:
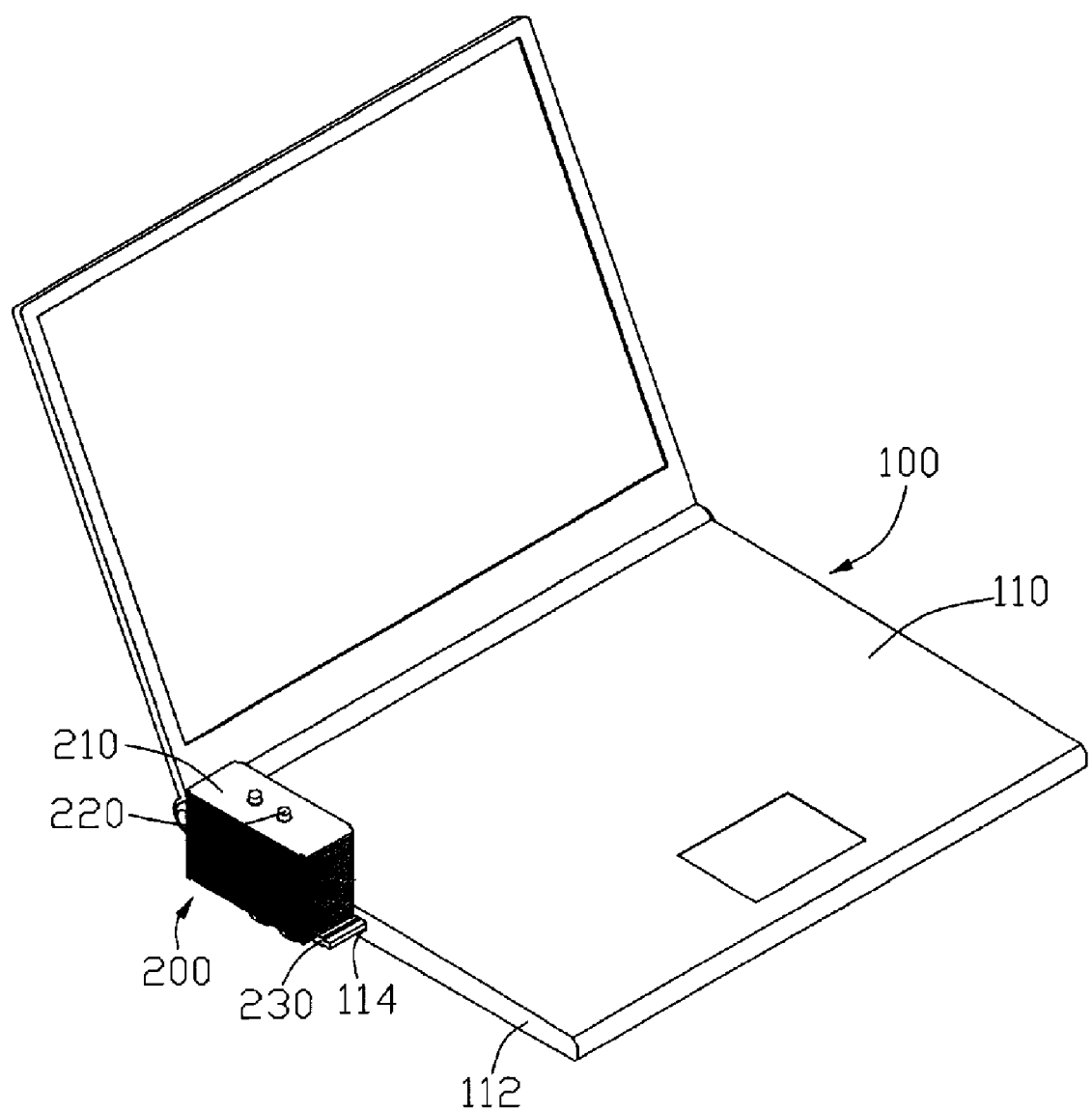
FIG. 3 is an assembled view of FIG. 1.

Referring to FIG. 1 and FIG. 3, when the portable computer 100 starts operation, the conducting plate 230 with the evaporating portions 221 of the heat pipes 220 is partly inserted in the extensible interface 114 of the base portion 110 of the portable computer 100 until a right side of the fins 210 abuts against the lateral portion 112 of the portable computer 100, and the fins 210 with the condensing portions 222 of the heat pipes 220 are positioned at an external space of the portable computer 100. A majority of the heat generated by the heat-generating electronic components in the portable computer 100 is absorbed by the conducting plate 230, and conducted to the fins 200 via the heat pipes 220. From the fins 210, the heat is taken away into external and surrounding air of the portable computer 100. Accordingly, the heat in the portable computer 100 can be quickly dissipated into the outer surrounding air.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat sink attached to an extensible interface of a portable computer, comprising:

a conducting plate inserted in the extensible interface of the portable computer;

a plurality of fins located at an external space of the portable computer; and a heat pipe thermally connecting the conducting plate and the fins;

wherein the heat pipe is L-shaped, and comprises an evaporating portion soldered to the conducting plate and a condensing portion extending through the fins; and wherein the conducting plate defines a slot for receiving the evaporating portion of the heat pipe therein.

2. The heat sink as described in claim 1, wherein the evaporating portion of the heat pipe is flattened.

3. The heat sink as described in claim 1, wherein a pair of steps is formed at opposite lateral sides of the conducting plate.

4. The heat sink as described in claim 3, wherein a thickness of the step is less than that of the conducting plate.

5. The heat sink as described in claim 1, wherein a leading portion is formed at a lateral side of the conducting plate for engaging in the extensible interface of the portable computer.

6. The heat sink as described in claim 5, wherein the leading portion has a thickness less than that of the conducting plate for facilitating insertion of the leading portion in the extensible interface of the portable computer.

7. The heat sink as described in claim 5, wherein the leading portion comprises a pair of symmetrical legs and a middle portion connecting the legs.

8. A combination comprising:

a portable computer having a base portion and a lid portion pivotally connected with the base portion; and a heat sink comprising a plurality of fins located at an external space of the portable computer, a conducting plate extending from a side portion of the base portion into an inner space of the portable computer for absorbing heat in the portable computer, and a heat pipe transferring the heat absorbed by the conducting plate to the fins;

wherein the heat pipe comprises an evaporating portion fixed to the conducting plate, and a condensing portion fixed to the fins; and wherein the conducting plate forms a leading portion at a side thereof, for facilitating insertion of the conducting plate in the inner space of the portable computer.

9. The combination as described in claim 8, wherein an extensible interface is defined in the side portion of the base portion of the portable computer and the conducting plate is extended into the inner space of the portable computer through the extensible interface.

10. The combination as described in claim 9, wherein the conducting plate has a portion located outside the extensible interface.

11. The combination as described in claim 8, wherein the lid portion contains a flat panel display.

12. The combination as described in claim 8, wherein the leading portion comprises a pair of symmetrical legs and a middle portion connecting the legs.

13. The combination as described in claim 8, wherein the evaporating portion of the heat pipe is flattened.

14. A heat sink for dissipation of heat in a computer, comprising:

a base adapted for being inserted into the computer through a side wall of the computer to absorb the heat in the computer;

a fin assembly in thermal connection with the base, adapted for being located outside the computer and releasing the heat absorbed by the base to a surrounding air outside of the computer; and a heat pipe having an evaporation portion soldered to the base and a condensing portion soldered to the fin assembly;

wherein the evaporation portion of the heat pipe is flattened to be coplanar with a face of the base.

* * * * *